United States Patent [19]

Trotnick, Jr.

[11] 4,041,408

[45] Aug. 9, 1977

[54] PUSH-PULL AUDIO AMPLIFIER SYSTEM WITH MUTING

[75] Inventor: Vincent William Trotnick, Jr., West Newton, Pa.

[73] Assignee: RCA Corporation, New York, N.Y.

[21] Appl. No.: 741,510

[22] Filed: Nov. 12, 1976

[51] Int. Cl.² .............................................. H03F 3/26
[52] U.S. Cl. ..................................... 330/15; 179/1 P; 330/22; 330/28; 330/30 R; 330/84; 330/149
[58] Field of Search ...................... 330/14, 15, 22, 29, 330/30 R, 40, 28, 51, 84, 123, 124 R, 149; 325/348, 402, 403, 478; 179/1 P

[56] References Cited

U.S. PATENT DOCUMENTS 3,889,202  6/1975  Suzuki ..................................... 330/51

*Primary Examiner*—James B. Mullins
*Attorney, Agent, or Firm*—Eugene M. Whitacre; Paul J. Rasmussen; Robert L. Troike

[57] ABSTRACT

Audio signals are equally power divided with the power divided signals being 180° out-of-phase. These separate out-of-phase signals are separately applied to the inverting input of separate current-differencing type operational amplifiers wherein the out-of-phase signals are separately amplified. The separate operational amplifiers are individually connected to a different one of two amplifiers connected in push-pull. Muting of this audio output is achieved by passing a large DC current to the inverting input of the separate operational amplifiers simultaneously whereby the output level therefrom drops to a level that biases the push-pull amplifiers off.

4 Claims, 1 Drawing Figure

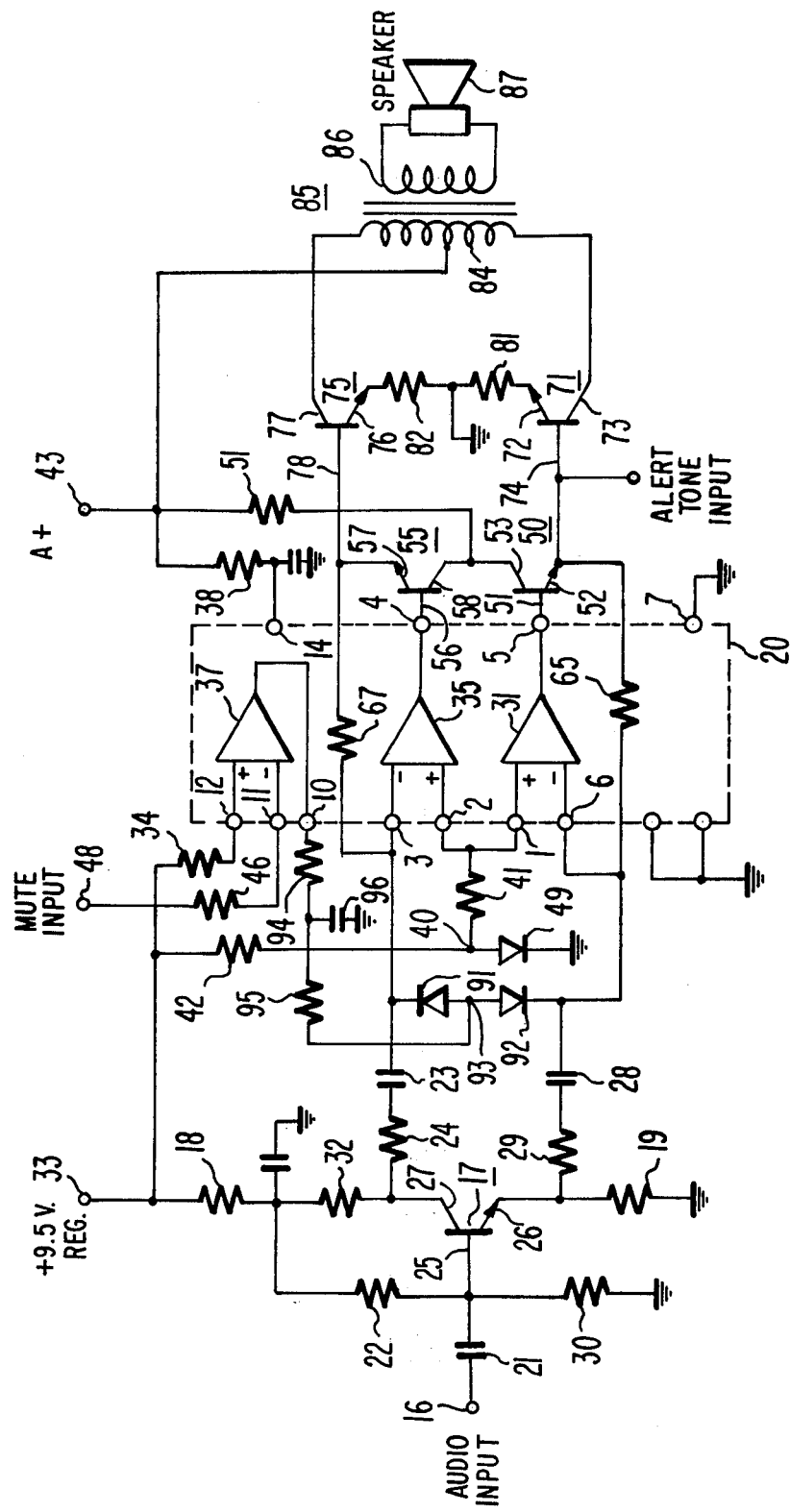

PUSH-PULL AUDIO AMPLIFIER SYSTEM WITH MUTING

BACKGROUND OF THE INVENTION

This invention relates to audio amplifiers and, more particularly, to audio amplifying systems including push-pull amplifiers with means for muting the output of these amplifiers.

Many types of muting or squelching systems are known. One such squelch system requires the receiver to be turned off unless a specific tone is accompanied with the carrier. Another type of squelch system requires the carrier to be present to permit reception of the received signal. In present two-way radio systems, it is also desirable to mute the output when transmitting. It has been found desirable to provide the muting or squelching of the receiver in the final output stages. These output stages for driving the speaker are usually push-pull amplifiers. A difficulty in muting push-pull amplifiers is that both active devices must be simultaneously biased off to prevent unwanted transients in the speaker. It is also desirable to provide some means for simultaneously turning off these push-pull driver amplifiers without using shunting devices which pass large currents when the receiver is being squelched or muted.

SUMMARY OF THE INVENTION

Briefly, the audio amplifier system includes a phase splitter for power dividing applied audio signals and providing one of the power divided signals to the inverting input of one current-differencing operational amplifier in a first phase and for providing an equal amplitude signal 180° out-of-phase with respect to said one power divided signal to the inverting input of a second current-differencing operational amplifier. The first and second operational amplifiers are individually coupled to a different one of two amplifiers connected in push-pull across an output coil. The muting of the audio output is achieved by passing a large DC current simultaneously to the inverting inputs of the operational amplifiers whereby the output level therefrom drops to a level that biases the push-pull amplifiers off.

BRIEF DESCRIPTION OF DRAWING

The sole FIGURE is a schematic drawing of the audio amplifying and muting system according to one embodiment of the present invention.

DESCRIPTION OF THE INVENTION

Referring to the FIGURE, there is illustrated by schematic drawing the audio amplifier and the muting circuit for a radio receiver. Relatively low powered single ended audio signals from an audio amplifier or discriminator at terminal 16 are coupled via coupling capacitor 21 to a phase splitter provided by transistor 17. This audio signal is applied to the base 25 of transistor 17. An in-phase signal is provided at the emitter 26 of transistor 17. A 180° out-of-phase signal of equal magnitude is provided at the collector 27. The DC bias level of transistor 17 is set by resistors 18, 19, 22, 30, 32 and bias source at terminal 33. The in-phase signals at the emitter 26 are AC coupled over a first path including resistor 29 and coupling capacitor 28 to the inverting input of operational amplifier 31 in a module 20. The out-of-phase signals are coupled over a second path including resistor 24 and coupling capacitor 23 to the inverting input of operational amplifier 35 in module 20.

Module 20 contains four operational current-differencing or "Norton" type operational amplifiers. These amplifiers are for example constructed on a single monolithic integrated circuit in a so-called "quad op amp" format. This module 20 of four current-differencing operational amplifiers is sold by RCA as CA 3401, by National Semiconductor as LM 3900 or by Motorola Semiconductor as MC 3301P. The RCA address is RCA Solid State Division, Box 3200, Somerville, N.J. The National Semiconductor address is 2900 Semiconductor Drive, Santa Clara, Calif. 95051. The Motorola Semiconductor address is Box 20912, Phoenix, Ariz. 85036. These operational amplifiers in module 20 have a common bias which is supplied between pins 7 and 14. Pin 14 of module 20 is coupled via resistor 38 to A+ bias source at terminal 43 and pin 7 is grounded. The inverting input terminal of operational amplifier 31 is at pin 6 of the module 20 and the non-inverting input terminal of operational amplifier 31 is at pin 1 of the module. Th output of operational amplifier 31 is taken at pin 5 of the module 20. The inverting input terminal of operatinal amplifier 35 is at pin 3 of the module 20, the non-inverting input is at pin 2 and the output is at pin 4. The lower operational amplifier in module 20 is not used and the upper operational amplifier 37 in module 20 is used as a switch for the muting circuit. The non-inverting terminal of amplifier 37 is at pin 12 and is coupled via a resistor 34 to the voltage source at terminal 33. The inverting input of operational amplifier 37 at pin 11 is coupled via a resistor 46 to the squelch or mute input terminal 48. The output voltage from operational amplifier device 37 is taken at pin 10 of module 20.

In the type of operational amplifiers used herein, the non-inverting input function is achieved by making use of a "current-mirror" to "mirror" the non-inverting input current about ground and then to extract this current from that which is entering the inverting input terminal. Whereas, the conventional operational amplifier differences input voltages, this amplifier differences input currents to provide a voltage output. For schematic details of such "op amp quads" refer to the data sheets on the above named commercial devices. Input resistors must be added to convert the input voltages to input currents in order to realize the operational amplifier applications.

A low level temperature compensated reference voltage source at junction 40 is provided by resistor 42 and diode 49 coupled in series between source terminal 33 and ground. Low level reference current to the non-inverting terminals (pins 1 and 2) of operational amplifiers 31 and 35 is provided through resistor 41 connected to junction 40. The output of operational amplifier 31 at pin 5 is coupled to the base 51 of emitter follower transistor 50. Th output of operational amplifier 35 at pin 4 is coupled to the base 56 of emitter follower transistor 55. The collectors 53 and 58 of transistors 50 and 55, respectively, are connected to an A+ source of biasing potential via resistor 51 and terminal 43. The emitter 52 of transistor 50 is directly connected via resistor 65 to the inverting input (pin 6) of operational amplifier 31 and to the base 74 of transistor 71. Similarly, the emitter 57 of transistor 55 is directly connected via resistor 67 to the inverting input (pin 3) of operational amplifier 35 and to the base 78 of transistor 75. Resistors 65 and 67 are of equal value and are selected to in the steady state condition provide equal currents in the inverting and non-inverting inputs and to bias the operational amplifiers and transistors 50 and 55 in their linear region. In this steady state condition with equal currents in the inverting and non-inverting inputs, the output voltages from the operational amplifiers 31 and 35 are sufficient to forward bias the transistors 50 and 55 in their linear region whereby the emitter output voltage from transistors 50 and 55 forward biases transistors 71 and 75. These emitter follower transistors 50 and 55 function to increase the current output of the operational amplifiers.

When differences in current occur between the inverting and non-inverting inputs of the operational amplifier a change in voltage is provided at the outputs of the emitter follower transistors 50 and 55. These changes in voltage cause by the addition of the feedback resistors 65 and 67 changes in the current level at the inverting inputs which are proportional to the voltage output level. Therefore, if the emitter output level from transistors 50 or 55 is increased, the voltage acts to produce increased current which is fed back to the inverting input of the operational amplifier tending to decrease the voltage output therefrom and equalize the input current. Conversely, a lower output level from the emitter follower causes a decrease in the input current to the operational amplifier increasing the voltage output therefrom. The feedback adjustment permits temperature and power supply stabilization while faithfully providing an amplified reproduction of the audio input. The AC gain of operational amplifier 31 is established by the ratio of resistors 29 and 65. Similarly, the AC gain of operational amplifier 35 is established by the ratio of resistors 24 and 67.

The output voltage changes at the emitters of transistors 50 and 55 are coupled respectively to the bases 74 and 78 of transistors 71 and 75. The transistors 71 and 75 are DC biased into Class AB operation by having their emitters 72 and 76 coupled to ground through equal valued resistors 81 and 82 and the collectors 73 and 77 connected in push-pull across the primary 84 of transformer 85 with the center tap of the coil 84 connected to source terminal 43. The secondary 86 of the transformer 85 is coupled to the speaker 87.

The muting is provided via a pair of back to back diodes 91 and 92 with the cathode terminal of diode 92 connected to the inverting input (pin 6) of operational amplifier 31 and the cathode terminal of diode 91 connected to the inverting input (pin 3) of operational amplifier 35. The output of operational amplifier 37 (pin 10) is coupled via a current shaping circuit made up of resistors 94 and 95 and capacitor 96 to the junction 93 of the anodes of diodes 91 and 92. A reference current to the non-inverting input (pin 12) of operational amplifier 37 is provided by the source at terminal 33 via resistor 34. A current proportional to the squelch or muting level at terminal 48 is applied to the inverting input (pin 11) via resistor 46.

In the operation of the system as described above with the receiver unmuted or unsquelched, a relatively high voltage signal is at the mute input terminal 48. This provides a high level current to the inverting terminal (pin 11) of operational amplifier 37 causing a low level output at pin 10 and the diodes are non-conducting. The audio input applied to the base 25 of the phase splitter transistor 17 is equally divided and 180° out-of-phase signal currents developed in resistors 29 and 24 are separately coupled via capacitors 28 and 23 to the inverting inputs (pins 6 and 3) of operational amplifiers 31 and 35. As the current to the inverting inputs of these operational amplifiers increases, the voltage output decreases and when the input current decreases, there is an increase in voltage output. Consequently, the signal voltage through these operational amplifiers 31 and 35 are amplified and phase inverted. Since the phase split signals from the splitter are both coupled to the inverting terminals (are both phase inverted), the two signal outputs remain 180° out-of-phase. These amplified signals are coupled through emitter follower transistors 50 and 51 and are seperately applied to the bases 74 and 78 of output transistors 71 and 75 to drive the primary coil 84 of transformer 85 in push-pull. This output is muted by the application of a relatively high level current to the anodes of diodes 91 and 92.

When a squelch signal appears at terminal 48, the voltage level at terminal 48 is low and the corresponding current level to inverting terminal (pin 11) of operational amplifier 37 is low causing a substantially high voltage level to appear at the output (pin 10) of operational amplifier 37. The voltage level causes the diodes 91 and 92 to be forward biased and a relatively large DC current is established via resistors 94 and 95 which is divided and applied equally to the inverting inputs of operational amplifiers 31 and 35. These large DC currents cause the output voltage level at both of these operational amplifiers 31 and 35 to simultaneously drop to sufficiently low value that the following emitter follower transistors 50 and 55 are cut-off. Consequently, there is no feedback current developed across resistors 65 and 67 and the base bias to both push-pull amplifiers 71 and 75 is simultaneously reduced to zero. This results in opposing currents in the coil 84 of transformer 85 that cancel each other and thus reducing the net switching transient output at the speaker 87 to a small value.

In some mobile systems, it is desired to provide an alerting tone to the speaker of the receiver when the transmitter has been operating over a predetermined time period. This alerting tone must be provided while the speaker is being muted. In the arrangement described above, this alerting tone can be applied for example as a current into the base 72 of transistor 71.

A circuit like that described above was built and tested and the components were of the following values and types with the voltage at terminals 33 and 43 being 9.5 volts and 13 volts, respectively.

| | |
|---|---|
| Module 20 | MC3301P |
| Transistor 17 | 2N4124 |
| Transistors 50 and 55 | 2N5810 |
| Transistors 71 and 75 | 2N6101 |
| Resistor 22 | 62 ± 5% K ohms, ¼ watt |
| Resistor 30 | 20 ± 5% K ohms, ¼ watt |
| Resistor 18 | 3.3 ± 10% K ohms, ¼ watt |
| Resistors 19 and 32 | 3 ± 5% K ohms, ¼ watt |
| Resistor 34 | 330 ± 1% K ohms, ¼ watt |
| Resistors 24 and 29 | 12 ± 5% K ohms, ¼ watt |
| Resistor 42 | 10 ± 10% K ohms, ¼ watt |
| Resistor 41 | 160 ± 5% K ohms, ¼ watt |
| Resistor 46 | 10 ± 10% K ohms, ¼ watt |
| Resistors 65 and 67 | 200 ± 5% K ohms, ¼ watt |
| Resistor 51 | 47 ± 10% ohms, ¼ watt |
| Resistor 38 | 150 ± 10% K ohms, ¼ watt |
| Resistors 81 and 82 | 0.47 ohms, 2 watts |
| Resistor 94 | 20 ± 5% K ohms, ¼ watt |
| Resistor 95 | 1 ± 5% K ohm, ¼ watt |
| Capacitor 21 | 0.015 microfarad |
| Capacitor 23 | 0.10 ± 5% microfarad |
| Capacitor 28 | 0.10 ± 5% microfarad |
| Capacitor 96 | 0.47 ± 10% microfarad |
| Transformer 85 | 4.5 ohms primary impedance with 8 ohms secondary |

In the above described arrangement using the components listed above, the low level reference current to the non-inverting inputs was about 1 microampere with the output from the emitter followers in the steady state condition being about 0.6 volt and 1.2 volts from the operational amplifiers. When the muting level is provided to the back to back diodes, the current changes from zero to 0.5 milliamperes to the junction of the diodes and the emitter follower output during muting drops to zero.

What is claimed is:

1. In an audio amplifying system including a pair of amplifiers connected in push-pull for driving a loud speaker coil, the combination therewith for amplifying and muting the speaker comprising:

a pair of current-differencing operational amplifiers characterized by inverting and non-inverting current responsive inputs to provide an output voltage proportional to the difference in the input currents, each of said operational amplifiers having a feedback circuit including a resistor coupled between the output and inverting input, means for coupling a first of said operational amplifiers to a first of said amplifiers connected in push-pull and for coupling the second of said operational amplifiers to the second of said amplifiers connected in push-pull, means for biasing said operational amplifiers to provide in the quiescent state a DC output voltage therefrom of a value sufficient to equally forward bias the first and second amplifiers connected in push-pull and to provide with the value of said feedback resistors substantially equal currents to the inverting and non-inverting inputs of said operational amplifiers whereby said operational amplifiers are biased into the linear region, phase splitter means having one output coupled to the inverting input of said first operational amplifier and having a second output terminal coupled to the inverting input of said second operational amplifier and being responsive to audio signals at the input for providing first power divided audio signals of a first phase and magnitude to the inverting input of said first operational amplifier and for providing second power divided audio signal of equal magnitude and 180° out-of-phase with said first power divided signal to the inverting input of said second operational amplifier whereby the first and second power divided audio signals are amplified and applied separately to said first and second amplifiers connected in push-pull, and muting means responsive to a squelching signal for simultaneously applying sufficient DC current to the inverting input terminals of both current differencing operational amplifiers to decrease the DC output level therefrom to a muting level below the forward bias level of said first and second amplifiers connected in push-pull to simultaneously bias said first and second amplifiers off and mute the speaker.

2. The combination of claim 1 wherein said feedback circuits include a transistor and said resistor connected in series between the output and said inverting input of said operational amplifier; said transistor in response to said muting level causing cut-off of the transistor whereby feedback current is interrupted.

3. The combination claimed in claim 1 wherein said muting means includes a pair of diodes with the anodes connected back to back at a junction and the cathodes connected to said inverting inputs of said operational amplifiers and means responsive to a muting signal for applying sufficent current to the anodes of said diodes to forward bias them.

4. The combination claimed in claim 3 wherein said muting means includes a third current-differencing operational amplifier coupled through a resistor to said junction of said diodes and responsive to a substantial drop in the input current level to the inverting input thereof indicative of a squelch signal for causing said sufficiently large DC current to be applied through said diodes to turn off said push-pull amplifiers.

* * * * *

UNITED STATES PATENT OFFICE
CERTIFICATE OF CORRECTION

PATENT NO. : 4,041,408

DATED : August 9, 1977

INVENTOR(S) : Vincent W. Trotnick, Jr.

It is certified that error appears in the above-identified patent and that said Letters Patent are hereby corrected as shown below:

In Column 4, line 63, "4.5" should read --14.5--.

Signed and Sealed this

Third Day of January 1978

[SEAL]

Attest:

RUTH C. MASON
Attesting Officer

LUTRELLE F. PARKER
Acting Commissioner of Patents and Trademarks